United States Patent
Pakarinen et al.

(10) Patent No.: US 10,283,137 B2
(45) Date of Patent: May 7, 2019

(54) DEVICE AND METHOD FOR TUNING A FREQUENCY-DEPENDENT ATTENUATION STAGE

(71) Applicants: Dolby International AB, Amsterdam (NL); DOLBY LABORATORIES LICENSING CORPORATION, San Francisco, CA (US)

(72) Inventors: Jyri Tapani Pakarinen, Solna (SE); Michael Smithers, Kareela (AU); Juan Felix Torres, Milsons Point (AU); Heiko Purnhagen, Sundbyberg (SE)

(73) Assignees: Dolby Laboratories Licensing Corporation, San Francisco, CA (US); Dolby International AB, Amsterdam Zuidoost (NL)

( * ) Notice: Subject to any disclaimer, the term of this patent is extended or adjusted under 35 U.S.C. 154(b) by 0 days.

(21) Appl. No.: 15/119,687

(22) PCT Filed: Feb. 18, 2015

(86) PCT No.: PCT/EP2015/053372
§ 371 (c)(1),
(2) Date: Aug. 17, 2016

(87) PCT Pub. No.: WO2015/124598
PCT Pub. Date: Aug. 27, 2015

(65) Prior Publication Data
US 2017/0061982 A1    Mar. 2, 2017

Related U.S. Application Data

(60) Provisional application No. 61/941,414, filed on Feb. 18, 2014.

(51) Int. Cl.
*H03G 5/00* (2006.01)
*H03G 5/16* (2006.01)
(Continued)

(52) U.S. Cl.
CPC ......... *G10L 21/0232* (2013.01); *H03G 5/005* (2013.01); *H03G 5/165* (2013.01); *H04R 3/04* (2013.01); *H04S 2400/09* (2013.01)

(58) Field of Classification Search
CPC ..... H04R 1/1083; H04R 3/04; H04R 2410/05
(Continued)

(56) References Cited

U.S. PATENT DOCUMENTS 3,940,715 A   2/1976  Lum
4,041,534 A   8/1977  Chabanel
(Continued)

FOREIGN PATENT DOCUMENTS

CN   1516493      7/2004
CN   101411213    4/2009
(Continued)

OTHER PUBLICATIONS

Henthorne, C. "Sonifying Performance Data to Facilitate Tuning of Complex Systems" Proc. of the ACM International Conference Companion on Object Oriented Programming System Languages and Applications Companion, pp. 35-42, Oct. 17-21, 2010.
(Continued)

*Primary Examiner* — Alexander Jamal (57) ABSTRACT

A device (160) and a method are proposed for tuning a frequency-dependent attenuation stage (122), with the purpose of suppressing non-linear distortion occurring in an audio reproduction system (120) associated with the frequency-dependent attenuation stage. The device comprises a receiving section (162) adapted to receive data representing an output acoustic signal (140) from the audio reproduction system, recorded upon excitation of the audio reproduction system by a predetermined input data signal (110) a first distortion detection section (163) adapted to detect presence of non-linear distortion based on the received data and to
(Continued)

apply psycho-acoustic compensation to the detected non-linear distortion and a control section (164) adapted to determine, based on the psycho-acoustically compensated non-linear distortion, control information (170) suitable for controlling the frequency-dependent attenuation stage.

20 Claims, 4 Drawing Sheets

(51) Int. Cl.
*G10L 21/0232* (2013.01)
*H04R 3/04* (2006.01)

(58) Field of Classification Search
USPC .................. 381/103, 102, 71.6, 71.11, 94.3
See application file for complete search history.

(56) References Cited

U.S. PATENT DOCUMENTS

| | | | |
|---|---|---|---|
| 5,577,126 A | 11/1996 | Klippel | |
| 6,108,431 A | 8/2000 | Bachler | |
| 6,154,550 A | 11/2000 | Beyer | |
| 6,570,985 B1 | 5/2003 | Romesburg | |
| 6,718,039 B1 | 4/2004 | Klayman | |
| 7,515,895 B2 | 4/2009 | Vorenkamp | |
| 7,564,979 B2 | 7/2009 | Swartz | |
| 7,742,746 B2 | 6/2010 | Xiang | |
| 8,082,051 B2 | 12/2011 | Mihelich | |
| 8,090,120 B2 | 1/2012 | Seefeldt | |
| 8,144,882 B2 | 3/2012 | Christoph | |
| 8,199,933 B2 | 6/2012 | Seefeldt | |
| 8,509,450 B2 | 8/2013 | Sun | |
| 8,538,042 B2 | 9/2013 | Yang | |
| 9,036,830 B2* | 5/2015 | Tanaka | G10L 21/0208 381/94.3 |
| 9,083,298 B2 | 7/2015 | Seefeldt | |
| 2008/0132295 A1* | 6/2008 | Horowitz | H04R 25/453 455/570 |
| 2010/0215193 A1 | 8/2010 | Wihardja | |
| 2010/0303250 A1* | 12/2010 | Goldberg | H04R 29/001 381/59 |
| 2011/0019846 A1 | 1/2011 | Anderson | |
| 2011/0075853 A1 | 3/2011 | Anderson | |
| 2012/0183150 A1 | 7/2012 | Christoph | |
| 2013/0003989 A1 | 1/2013 | Tsang | |
| 2013/0054251 A1* | 2/2013 | Eppolito | H03G 7/007 704/500 |
| 2013/0322641 A1* | 12/2013 | Carreras | G10L 21/0208 381/71.6 |

FOREIGN PATENT DOCUMENTS

| | | |
|---|---|---|
| CN | 102460567 | 5/2012 |
| FR | 2890280 | 3/2007 |
| JP | 3-19513 | 1/1991 |
| JP | 07-122953 | 5/1995 |
| JP | 2007-081815 | 3/2007 |
| JP | 2010-109992 | 5/2010 |
| JP | 2012-114826 | 6/2012 |
| JP | 2013-051727 | 3/2013 |
| JP | 2014-220589 | 11/2014 |
| WO | 95/15035 | 6/1995 |
| WO | 98/51066 | 11/1998 |
| WO | 2007/120453 | 10/2007 |
| WO | 2013/049125 | 4/2013 |

OTHER PUBLICATIONS

Pandey, A. et al "Offending Frequency Suppression with a Reset Algorithm to Improve Feedback Cancellation in Digital Hearing Aids" IEEE International Conference on Acoustics, Speech and Signal Processing, pp. 301-304, May 22-27, 2011.

Wilkerson, J. et al "Automated Broadband High-Dynamic-Range Nonlinear Distortion Measurement System" IEEE Transactions on Microwave Theory and Techniques, vol. 58, No. 5, May 2010, pp. 1273-1282.

Gopalakrishna, V. et al "Real-Time Automatic Tuning of Noise Suppression Algorithms for Cochlear Implant Applications" IEEE Transactions on Biomedical Engineering, vol. 59, No. 6, Jun. 2012, pp. 1691-1700.

Temme, S. et al "Practical Measurement of Loudspeaker Distortion Using a Simplified Auditory Perceptual Model" AES Convention Paper, presented at the 127th Convention, Oct. 9-12, 2009, New York, USA, pp. 1-17.

Hood, Rush "Design Factors in a Fully Automated Distortion Analyzer" AES Convention presented at the 66th Convention May 6-9, 1980, pp. 1-8.

Robinson, D. et al "Psychoacoustic Models and Non-Linear Human Hearing" AES 109th Convention, Los Angeles, Sep. 22-25, 2000, pp. 1-14.

Cabot, Richard C. "Design Factors in a Programmable Distortion Measurement System" JAES vol. 32, Issue 12, pp. 964-983, Dec. 1984.

Baumgarte, Frank "A Physiological Ear Model for Auditory Masking Applicable to Perceptual Coding" AES Convention: 103, Sep. 1997, pp. 1-37.

Vandersteen, G. et al "eSYSID: A Proposal for a Flexible Electronic SYStem IDentification Test Bench" I2MTC 2009—International Instrumentation and Measurement Technology Conference, Singapore, May 5-7, 2009, pp. 1-6.

Sasaki, N. et al "Effect of Nonlinear Distortion of a Loudspeaker on an Impulse Response", Proceedings of the Acoustical Society of Japan, pp. 761-762, Sep. 2013.

\* cited by examiner

DEVICE AND METHOD FOR TUNING A FREQUENCY-DEPENDENT ATTENUATION STAGE

CROSS-REFERENCE TO RELATED APPLICATION

This application claims priority to U.S. Provisional Priority Application No. 61/941,414 filed Feb. 18, 2014, which is hereby incorporated by reference in its entirety.

TECHNICAL FIELD

Example embodiments disclosed herein generally relates to audio reproduction systems and in particular to suppression of distortion occurring in audio reproduction systems.

BACKGROUND

It is a current trend in the audio industry to use digital signal processing for improving the sound quality of consumer audio reproduction systems. Typical shortcomings of compact or inexpensive audio reproduction systems include for example non-flat magnitude response, modest ability to radiate low frequencies and noise. Another undesirable property of many such systems is the occurrence of non-linear distortion which may cause sound characteristics such as timbre and phase to change as a function of the sound amplitude. Non-linear distortion may also cause a non-linear magnitude response (with respect to intensity) at a given frequency, and may create new frequency components in the sound output, for example, at integer multiples of the frequencies of input frequency components (harmonics). As a result, playing two identical sounds with different playback gains on a non-linearly distorting audio reproduction system may result in two very different output sounds. A typical source of non-linear distortion in a commercial sound reproduction system is forcing a loudspeaker unit to operate outside its linear operation range in order to achieve a louder sound output without increasing costs for the transducer.

One way to suppress non-linear distortion is to attenuate the input signal before it is fed to the loudspeaker, but this also makes the system quieter, which is typically not acceptable. An approach to suppressing non-linear distortion while sacrificing only a little of the system's loudness is to use a dynamic range limiter which monitors the input signal and applies attenuation only for the loud parts, so that the amplitude of the signal fed to the loudspeaker never exceeds a given threshold value.

Since non-linear distortion is typically frequency-dependent, it is often desirable to apply the limiting separately to different frequency bands, so that only problematic frequency and signal magnitude combinations are attenuated. This approach, called multi-band limiting/compression, also alleviates some of the side effects related to dynamic range compression, such as 'volume pumping'.

However, as multi-band limiters/compressors attenuate different frequencies differently depending on the input signal, this may lead to perceptually disturbing timbral changes. In US Patent Application Publication No. 2013/0013096 A1, incorporated in its entirety herein, a multi-band compressor with timbre preservation is proposed to reduce such timbral changes.

As described above, several methods have been proposed for suppressing non-linear distortion occurring in an audio reproduction system, so as to improve sound quality of the audio reproduction system. However, it would be desirable to provide devices and/or methods mitigating at least some of the above described problems associated with suppression of non-linear distortion.

BRIEF DESCRIPTION OF THE DRAWINGS

Example embodiments will now be described with reference to the accompanying drawings, on which.

All the figures are schematic and generally only show parts which are necessary in order to elucidate the disclosure, whereas other parts may be omitted or merely suggested. Unless otherwise indicated, like reference numerals refer to like parts in different figures.

DESCRIPTION OF EXAMPLE EMBODIMENTS

I. Overview—Tuning

As used herein, an audio signal may be a pure audio signal, an audio part of an audiovisual signal or multimedia signal or any of these in combination with metadata.

According to example embodiments, a device for tuning a frequency-dependent attenuation stage with the purpose of suppressing non-linear distortion occurring in an audio reproduction system associated with the frequency-dependent attenuation stage is provided. The audio reproduction system associated with the frequency-dependent attenuation stage tuned by the device is arranged to supply an output acoustic signal in response to an input data signal. The device comprises a receiving section adapted to receive data representing an output acoustic signal recorded upon excitation of the audio reproduction system by a predetermined input data signal. The device also comprises a first distortion detection section adapted to detect presence of non-linear distortion based on the received data and to apply psycho-acoustic compensation to the detected non-linear distortion. The device further comprises a control section adapted to determine, based on the psycho-acoustically compensated non-linear distortion, control information suitable for controlling the frequency-dependent attenuation stage.

By a frequency-dependent attenuation stage is meant, inter alia, a processing stage adapted to perform frequency-dependent attenuation on an audio signal or an audio part of a multimedia signal, for example, a multi-band limiter. The frequency-dependent attenuation stage attenuates signals to be played back by the audio reproduction system in order to reduce the amount of non-linear distortion created in the audio reproduction system, rather than attenuating non-linear distortion already present.

By non-linear distortion is meant distortion caused by non-linear effects of audio reproduction systems, for example, effects causing changes in sound characteristics such as timbre and/or phase as a function of sound amplitude. Non-linear distortion may for example include harmonic distortion components located at or near frequencies that are integer multiples of the input frequencies.

The tuning of the frequency-dependent attenuation stage, based on non-linear distortion detected upon excitation of a particular audio reproduction system by the predetermined input data signal, takes into account the distortion behavior of that particular audio reproduction system and allows for a more efficient suppression of non-linear distortion occurring in that particular audio reproduction system.

Psycho-acoustic effects influence how non-linear distortion in the output of the audio reproduction system is perceived by a listener. By applying a psycho-acoustic compensation on the detected non-linear distortion and determining the control information for controlling the frequency-dependent attenuation stage based on the psycho-acoustically compensated non-linear distortion, the frequency-dependent attenuation stage may be tuned to more efficiently suppress perceptible/audible non-linear distortion and/or to reduce unnecessary attenuation of audio content which would mainly have caused non-audible or not particularly annoying non-linear distortion. In other words, the application of psycho-acoustic compensation during tuning of the frequency-dependent attenuation stage may improve the balance between audible non-linear distortion created by the audio reproduction system and the overall loudness of the audio reproduction system.

The predetermined input data signal may for example be known a priori by the device and may for example be provided by the device to the audio reproduction system as a part of a predetermined procedure of tuning the frequency-dependent attenuation stage. Alternatively, information about the predetermined input data signal may for example, be obtained by the device based on the received data and/or may be received separately by the device.

According to an example embodiment, the first distortion detection section may be adapted to apply psycho-acoustic compensation by at least disregarding spectral content of the detected non-linear distortion below a frequency-dependent audibility threshold.

For a given frequency, the frequency-dependent audibility threshold may for example be set as an amplitude/power/energy level at which audio content at the given frequency becomes audible/perceptible to an average human listener. Alternatively, the audibility threshold may be set lower so that only audio content well-below hearing level is disregarded, or the audibility threshold may be set at a higher level so that audio content perceived by an average listener as sufficiently weak/quiet is disregarded.

Disregarding spectral content below the frequency-dependent audibility threshold may include disregarding those frequency components of the detected non-linear distortion having an amplitude/power/energy level below the frequency-dependent audibility threshold. For instance, it may be assumed in subsequent processing steps that the distortion spectrum is zero in the corresponding frequency ranges.

According to at least some example embodiments, disregarding spectral content below the frequency-dependent audibility threshold may also include reducing the amplitude/power/energy levels of detected non-linear distortion components by levels of the frequency-dependent audibility threshold at frequencies corresponding to the respective non-linear distortion components, i.e. it may include a form of normalization with respect to the frequency-dependent audibility threshold. Subsequent processing steps may for example, be based on the reduced/normalized amplitude/power/energy levels of the detected non-linear distortion components.

According to an example embodiment, the first distortion detection section may be adapted to calibrate the frequency-dependent audibility threshold based on a sound pressure level estimated in connection with the recording of the output acoustic signal represented by the received data. The sound pressure level may serve as a link between the received data representing the output acoustic signal and physical quantities relevant for estimating how the output acoustic signal is perceived by a listener, and may facilitate an appropriate calibration of the frequency-dependent audibility threshold.

According to an example embodiment, the first distortion detection section may be adapted to apply psycho-acoustic compensation by at least: obtaining knowledge of a first frequency component of the predetermined input data signal; estimating, based on the first frequency component, a masking threshold for a neighborhood of the first frequency component; and disregarding spectral content of the detected non-linear distortion below the masking threshold thus estimated.

When the audio reproduction system is excited by the predetermined input data signal, the first frequency component of the predetermined input data signal gives rise to spectral content of the received data that is localized substantially at the same frequency as the first frequency component, and this spectral content has a masking effect on other audio content of the received audio signal.

Disregarding spectral content below the masking threshold may include disregarding those frequency components of the detected nonlinear distortion having an amplitude/power/energy level below the masking threshold.

According to some example embodiments, the predetermined input audio signal and the first frequency component may be known a priori by the device and/or by the first distortion detection section, and may for example, be provided to the audio reproduction system by an interface comprised in the device. According to other example embodiments, knowledge of the first frequency component may be received by the first distortion detection section or may be obtained based on the received data.

According to an example embodiment, the first distortion detection section may be adapted to: obtain knowledge of a first frequency component of the predetermined input data signal; and detect, based on the received data, non-linear distortion components corresponding to the first frequency component. In other words, according to the present example embodiment, the first distortion detection section may be adapted to detect, based on the received data, non-linear distortion components resulting from excitation of the audio reproduction system by the first frequency component When the audio reproduction system is excited by the predetermined input data signal, the first frequency component of the predetermined input data signal gives rise to spectral content of the received data that is localized substantially at the same frequency as the first frequency component as well as non-linear distortion components located at other frequencies, for example, harmonic components located at or near integer multiples of the frequency of the first frequency component.

According to an example embodiment, the first distortion detection section may be adapted to determine a power ratio between the power of such spectral content of the received data that is localized substantially at the same frequency as the first frequency component and a sum of powers of the non-linear distortion components. According to the present example embodiment, the control section may be adapted to determine the control information also based on the power ratio.

According to an example embodiment, the first distortion detection section may be adapted to apply psycho-acoustic compensation at least by normalizing, prior to forming the power ratio, the power of the spectral content of the received data localized substantially at the same frequency as the first frequency component, and by further normalizing the powers of the non-linear distortion components, wherein the normalizations are performed with respect to a frequency-dependent audibility threshold. In other words, prior to forming the power ratio, both the numerator and the denominator are reduced by normalizing the respective spectral content or components with respect to the frequency-dependent audibility threshold. By normalizing the respective spectral content or components with respect to the frequency-dependent audibility threshold, prior to forming the power ratio, the obtained value of the power ratio may more adequately indicate a power ratio (or a difference in intensity) between desired sound output and non-linear distortion, as perceived by a listener.

In some example embodiments, the first distortion detection section may be adapted to calibrate the frequency-dependent audibility threshold based on a sound pressure level estimated in connection with the recording of the output acoustic signal represented by the received data.

According to an example embodiment, the first distortion detection section may be adapted to apply psycho-acoustic compensation by at least: assigning harmonic indices to the non-linear distortion components; and applying weights to the non-linear distortion components based on the harmonic indices, for example, prior to forming a power ratio.

The harmonic indices relate the frequencies at which the non-linear distortion components (also called harmonic distortion components) are located to a basic frequency present in the excitation signal input to the audio reproduction system. Different harmonic distortion components are typically not perceived as equally disturbing by listeners. The second harmonic component, for example, is often reported as having a much more subtle effect on the sound than higher-order harmonic components. This may be taken into account by weighting the non-linear distortion components based on their harmonic indices, for example, by giving the second harmonic component relatively less weight According to some example embodiments, at least one of the non-linear distortion components may, based on its harmonic index, be disregarded.

According to an embodiment, the first distortion detection section may be adapted to apply psycho-acoustic compensation at least by estimating a loudness of the spectral content of the received data localized substantially at the same frequency as the first frequency component, and estimating a combined loudness of the non-linear distortion components. According to the present example embodiment, the control section may be adapted to determine the control information also based on a difference between the estimated loudnesses. Loudness as perceived by a listener is typically frequency-dependent and may be accounted for by for example, rescaling or weighting the non-linear distortion components based on the respective frequency regions that they are located in. The combined loudness of the non-linear distortion components may for example be estimated using a loudness summation scheme. According to an example embodiment, the device may comprise a second distortion detection section adapted to: obtain knowledge of a frequency range covering the spectral content of the predetermined input data signal, and detect non-linear distortion based on spectral content of the received data above the frequency range. According to the present example embodiment, the control section may be adapted to determine the control information also based on the non-linear distortion detected by the second distortion detection section.

It is to be noted that according to some example embodiments, the predetermined input data signal may comprise relatively weak noise, for example, noise with a total energy of at most 5 or 10 percent of the total energy of the predetermined input data signal. In such circumstances, the frequency range referred to here and in the claims need not include frequencies where only noise is present.

Occurrence of spectral content of the received data for frequencies above the frequency range covering the spectral content of the predetermined input data signal may be indicative of non-linear distortion. The detection of non-linear distortion by the second distortion detection section may serve as a complement to the detection of non-linear distortion by the first distortion detection section. By determining the control information based on results from detections of non-linear distortion by both these two distortion detection sections, suppression of non-linear distortion in the audio reproduction system may be improved.

According to an example embodiment, the device may be adapted to receive data recorded upon excitation of the audio reproduction system by a sequence of predetermined input data signals, wherein consecutive predetermined input data signals in the sequence corresponds to increasingly amplified versions of a predetermined waveform. According to the present example embodiment, the device may comprise a spectral composition analysis section adapted to: monitor, based on the received data, the spectral composition of the output audio signals of the audio reproduction system resulting from excitation by the sequence of predetermined input data signals; detect an abrupt change in the monitored spectral composition; and determine an amplification value of the predetermined waveform corresponding to the detected abrupt change. According to the present example embodiment, the control section may be adapted to determine the control information also based on the amplification value determined by the spectral composition analysis section.

For example, the amplification value determined by the spectral composition analysis section may be used by the control section to identify a maximum energy/power level below which the spectral content of a particular frequency band must always be kept by the frequency-dependent attenuation stage in order to avoid operation of a loudspeaker outside its linear operation interval. The information about psycho-acoustically compensated non-linear distortion from the first distortion detection section may for example be used by the control section to determine attenuation levels for the frequency-dependent attenuation stage when the energy/power level in that particular frequency band is already below the maximum energy/power level.

The predetermined waveform may for example be a single sine signal or a more composite audio signal comprising multiple frequency components. The predetermined waveform may for example be a narrow-band signal, so that non-linear distortion properties of the audio reproduction system may be analyzed for a particular frequency band.

If, for example, the individual elements of the sequence of predetermined input data signals are separated in time, for example, by input data representing silence, the spectral composition analysis section may be adapted to determine the spectral composition of the output acoustic signal of the audio reproduction system at discrete points in time corresponding to the respective elements of the sequence of predetermined input data signals, and may be adapted to detect abrupt changes between values of the spectral composition determined at the respective points in time. It is to be noted that several schemes for combining consecutive time segments of audio into a single continuous audio sequence are known to the skilled person, at least some of which may be employed to reduce transients and/or other artifacts caused by appending one time segment of audio after another. Such schemes may for example have been employed to combine the elements of the sequence of predetermined input data signals into a single input data signal to be used as excitation to the audio reproduction system, so as to reduce the contribution from transients/artifacts, caused by appending one time segment of audio after another, in the monitored spectral content.

If, for example, the predetermined waveform is a single sine signal, the sequence of predetermined input data signals may be received by the audio reproduction system in the form of a the single sine signal with for example, gradually or continuously increasing amplitude, and the spectral composition of the output acoustic signal of the audio reproduction system may for example, be monitored continuously by the spectral composition analysis section, rather than being monitored/determined at discrete time points corresponding to individual elements of the sequence of predetermined input data signals. In the present example, the spectral composition analysis section may be adapted to detect abrupt changes in the continuously monitored spectral composition.

The spectral composition may be monitored for example, by estimating the spectral centroid and/or the cepstral maximum. An abrupt change in the monitored spectral composition is indicative of the audio reproduction system reaching an upper end of its linear operation range, outside which the amount of non-linear distortion may increase significantly. The amplification value of the predetermined waveform corresponding to the detected abrupt change, may also correspond to an energy/power/amplitude level associated with the upper end of the linear operation range of the audio reproduction system, and the control section may be adapted to determine the control information also based on this energy/power/amplitude level.

According to an example embodiment, the device may comprise a correlation analysis section adapted to determine coherence between the predetermined input data signal and the received data. With this setup, the control section may be adapted to determine the control information also based on values of the coherence determined by the coherence analysis section. For example, low coherence between the predetermined input data signal and the received data may indicate presence of non-linear distortion, especially under low noise conditions.

According to an example embodiment, the correlation analysis section may be adapted to: determine a cross-correlation between the predetermined input data signal and the received data; estimate a sample rate difference between the predetermined input data signal and the received data based on the determined cross-correlation; and determine the coherence based on a re-sampled version of the received data. Re-sampling the received data may be used to improve time synchronicity between the predetermined input data signal and the received data, and may reduce noise in the determined coherence.

According to an example embodiment, the device may be adapted to receive data recorded upon excitation of the audio reproduction system by a sequence of predetermined input data signals, wherein consecutive predetermined input data signals in the sequence correspond to increasingly amplified versions of a predetermined waveform. According to the present example embodiment, the device may comprise a dynamic range control (DRC) detection section adapted to: monitor, based on the received data, the amplitude of the output acoustic signal from the audio reproduction system resulting from excitation of the audio reproduction system by the sequence; and detect a saturation of the monitored amplitude, evidencing presence of DRC in the audio reproduction system. According to the present example embodiment, the control section may be adapted to determine the control information also based on an outcome of the detection by the DRC detection section.

For a given audio reproduction system, there is typically an upper limit for the amplitudes obtainable in the acoustic output, resulting for example, from physical limitations in an amplification stage and/or in a loudspeaker, even without DRC. By a detected saturation evidencing presence of DRC in the audio reproduction system is meant a saturation of the monitored amplitude at a level below such upper limit.

According to an example embodiment, the sequence of predetermined input data signals may correspond substantially to a single-frequency audio signal with increasing amplitude. According to the present example embodiment, the DRC detection section may be adapted to: monitor, based on the received data, the amplitude of a frequency component in the output acoustic signal from the audio reproduction system, wherein the monitored frequency component is localized substantially at the same frequency as the single-frequency audio signal; and detect a saturation of the monitored amplitude of the frequency component, evidencing presence of DRC in the audio reproduction system.

According to an example embodiment, the control section may be adapted to determine, in response to the detection by the DRC detection section, control information for causing the frequency-dependent attenuation stage to suspend attenuation. The presence of DRC in the audio reproduction system may cause audible artifacts. In at least some example embodiments, it may therefore be beneficial for the frequency-dependent attenuation stage not to apply attenuation.

According to an example embodiment, the device may be adapted to receive data recorded upon excitation of the audio reproduction system by a constant input data signal. According to the present example embodiment, the device may be adapted to tune a frequency-dependent attenuation stage which is comprised in the audio reproduction system and is operable to attenuate the input data signal based on the control information determined by the control section of the device. According to the present example embodiment, the device may be adapted to tune the frequency-dependent attenuation stage by iteratively determining the control information based on the received data.

According to an example embodiment, the control section may be adapted to determine the control information by at least applying machine-learning based on a set of reference tunings of the frequency-dependent attenuation stage. The set of reference tunings may for example comprise: a set of reference data representing output acoustic signals recorded upon excitation of respective reference audio reproduction systems by the predetermined input data signal and reference control signals, corresponding to the respective reference data, for controlling the frequency-dependent attenuation stage for suppressing non-linear distortion occurring in the respective reference audio reproduction systems. The reference tunings may for example have been obtained by human tuners in listening assays. The control section may for example comprise a memory in which the reference tunings are stored.

According to an example embodiment, the device may further comprise an interface adapted to provide the predetermined input data signal to the audio reproduction system. The interface may for example be wired or wireless.

According to an example embodiment, the device may further comprise an acoustic transducer adapted to record acoustic output from the audio reproduction system and to provide the data to the receiving section.

According to example embodiments, a method for tuning a frequency-dependent attenuation stage with the purpose of suppressing non-linear distortion occurring in an audio reproduction system associated with the frequency-dependent attenuation stage is provided. The proposed method may generally have the same or corresponding features and advantages as those of the above proposed devices. In particular, according to some example embodiments, the method may comprise receiving data representing an output acoustic signal recorded upon excitation of the audio reproduction system by a predetermined input data signal. The method may comprise detecting presence of non-linear distortion based on the received data. The method may comprise, applying psycho-acoustic compensation to the detected non-linear distortion and, based on the psycho-acoustically compensated non-linear distortion, determining control information suitable for controlling the frequency-dependent attenuation stage.

According to example embodiments, a computer program product may comprise a computer-readable medium with instructions for causing a computer to execute any of the above proposed methods. The proposed computer program product may generally have the same or corresponding features and advantages as those of the above proposed methods and devices.

Further example embodiments are defined in the dependent claims. It is noted that example embodiments include all combinations of features, even if recited in mutually different claims.

II. Overview—DRC Detection

Example embodiments propose methods, devices and computer program products for detecting presence of dynamic range control, DRC, in an audio reproduction system. The proposed methods, devices and computer program products for detecting presence of DRC in an audio reproduction system may generally share the same or corresponding features and advantages. It is to be noted that the proposed methods, devices and computer program products for detecting presence of DRC in an audio reproduction system are independent of, and combinable with, the respective methods, devices and computer program products described in the preceding section.

According to example embodiments, a method for detecting presence of dynamic range control (DRC) in an audio reproduction system, is provided. The audio reproduction system is arranged to supply an output acoustic signal in response to an input data signal. The method comprises receiving data representing an output acoustic signal recorded upon excitation of the audio reproduction system by a sequence of predetermined input data signals, wherein consecutive predetermined input data signals in the sequence correspond to increasingly amplified versions of a predetermined waveform; monitoring, based on the received data, the amplitude of the output acoustic signal from the audio reproduction system resulting from excitation of the audio reproduction system by the sequence; and detecting a saturation of the monitored amplitude, evidencing presence of DRC in the audio reproduction system.

For a given audio reproduction system, there is typically an upper limit on the amplitudes obtainable in the acoustic output, for example, resulting from physical limitations in an amplification stage and/or in a loudspeaker, even without presence of DRC. By a detected saturation evidencing presence of DRC in the audio reproduction system is meant a saturation of the monitored amplitude at a level distinct from (e.g., below) such an upper limit.

A loudspeaker of an audio reproduction system typically has a linear operating interval above which a significant portion of the energy content of the input signal is transferred/shifted, in the output signal, into energy of frequency components located at higher frequencies than the input signal, i.e. to non-linear distortion in the form of harmonic distortion components.

According to at least some example embodiments, a detected saturation evidencing presence of DRC in the audio reproduction system may be a saturation of the monitored amplitude at a level corresponding to operation of one or more loudspeakers and/or headphones of the audio reproduction system in its respective linear operating interval.

The upper end/limit of a linear operating interval may for example be determined by detecting an abrupt change in the spectral content/composition of the output acoustic signal of the audio reproduction system upon excitation of the audio reproduction system by a signal with gradually increasing amplitude/power, as described in example embodiments in the preceding section "I. Overview—Tuning".

According to an example embodiment, the method may comprise receiving data representing an output acoustic signal recorded upon excitation of the audio reproduction system by a sequence of predetermined input data signals corresponding substantially to a single-frequency audio signal with increasing amplitude. The method may comprise monitoring, based on the received data, the amplitude of a frequency component in the output acoustic signal from the audio reproduction system, the monitored frequency component being localized substantially at the same frequency as the single-frequency audio signal. The method may comprise detecting a saturation of the monitored amplitude, evidencing presence of DRC in the audio reproduction system. In other words, in the present example embodiment, the predetermined waveform is a single-frequency audio signal. Other example embodiments are also envisaged in which the predetermined waveform is a more composite signal, for example, comprising a plurality of frequency components.

According to example embodiments, a computer program product may comprise a computer-readable medium with instructions for causing a computer to execute any of the above proposed methods for detecting presence of DRC.

According to example embodiments, a dynamic range control, DRC, detection device for detecting presence of DRC in an audio reproduction system, is provided. The audio reproduction system is arranged to supply an output acoustic signal in response to an input data signal. The DRC detection device is adapted to receive data representing an output acoustic signal recorded upon excitation of the audio reproduction system by input data signals corresponding substantially to a single-frequency audio signal with increasing amplitude. The DRC detection device is also adapted to monitor, based on the received data, the amplitude of a frequency component in the output acoustic signal from the audio reproduction system. The monitored frequency component being localized substantially at the same frequency as the single-frequency audio signal and detect a saturation of the monitored amplitude, evidencing presence of DRC in the audio reproduction system.

III. Example Embodiments

Figure 1:
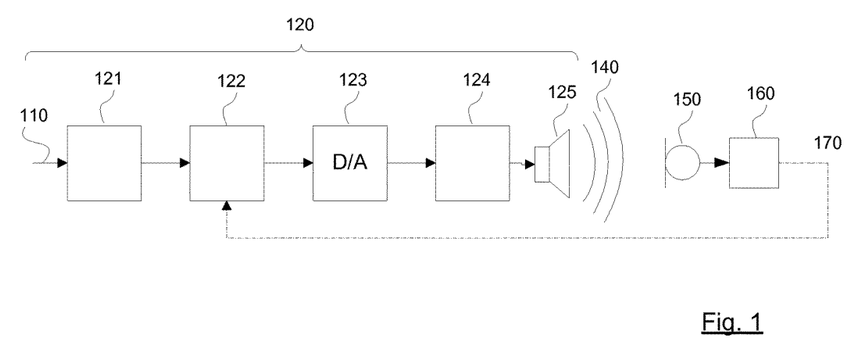
FIG. 1 is a generalized block diagram of an example arrangement for tuning a frequency-dependent attenuation stage using a device according to an example embodiment.

FIG. 1 is a generalized block diagram of an example arrangement for tuning a frequency-dependent attenuation stage 122 using a device 160 according to an example embodiment.

In the present example arrangement, an audio reproduction system 120 receives an input data signal 110 representing audio content to be played back by the audio reproduction system 120. The audio reproduction system 120 may for example be a consumer audio reproduction system comprised in a mobile device, or for example, a larger stationary audio reproduction system. The input data signal 110 may for example, be played from a file storage or from an external digital input. If the audio reproduction system 120 is comprised in a mobile device, the input data signal 110 may for example be transmitted from the device 160 to the audio reproduction system 120 via wireless communication.

In the present example arrangement, the audio reproduction system 120 supplies an output acoustic signal 140 in response to the input data signal 110. An acoustic transducer 150, for example, one or more microphones, records the acoustic output 140 from the audio reproduction system 120 and supplies data representing the recorded acoustic output to said device 160. Based on the received data, the device 160 tunes a frequency-dependent attenuation stage 122 associated with the audio reproduction system 120 with the purpose of suppressing nonlinear distortion occurring in the audio reproduction system 120.

In the present example arrangement, the audio reproduction system 120 comprises a processing stage 121, the frequency-dependent attenuation stage 122, a digital-to-analog conversion stage 123, an amplification stage 124 and one or more loudspeakers 125 or headphones. The processing stage 121 may implement one or more signal processing tasks on the input data signal 110, for example, mixing of audio signals/channels represented by the input data signal 110 and/or equalization for correcting/balancing the magnitude response of the audio reproduction system's loudspeakers 125. The processed input data signal is then supplied to the frequency-dependent attenuation stage 122. The purpose of the frequency-dependent attenuation stage 122 is to control the amount of non-linear distortion created in the remaining stages of the audio reproduction system 120, for example, in the digital-to-analog conversion stage 123, the amplification stage 124 and the loudspeakers 125 or headphones. By applying appropriate attenuation to the processed input data signal, non-linear distortion occurring in the audio reproduction system 120 may be suppressed (e.g., by avoiding high amplitudes in frequency intervals sensitive/susceptible to non-linear distortion) and a tradeoff may be made between audible non-linear distortion and the overall loudness of the audio reproduction system 120. The frequency-dependent attenuation stage 122 may for example be implemented as a multi-band limiter in which different frequency bands are attenuated independently of each other, or as a timbre-preserving multi-band limiter, as described in US patent application publication no. 2013/0013096 A1, the contents of which is incorporated herein in its entirety. The data signal output by the frequency-dependent attenuation stage 122 is then converted to analog form by the digital-to-analog conversion stage 123, and is amplified by the amplification stage 124, before it is fed to the loudspeakers 125 or headphones to be output as the output acoustic signal 140.

In order to control the non-linear distortion created in a particular sound reproduction system 120, the frequency-dependent attenuation stage 122 may be tuned based on information about the distortion behavior of the particular audio reproduction system 120. Such information may be obtained by example embodiments of the device 160, which will be described below with reference to FIG. 2.

It is to be noted that the audio reproduction system 120 depicted in FIG. 1 serves as an example of an audio reproduction system associated with a frequency-dependent attenuation stage tunable by the device 160. In particular, a frequency-dependent attenuation stage tunable by the device 160 may be associated with an audio reproduction system comprising a different combination of processing stages, conversion stages and/or amplification stages, than the audio reproduction system 120 depicted in FIG. 1. For example, a frequency-dependent attenuation stage tunable by the device 160 may be associated with an audio reproduction system without a digital-to-analog conversion stage 123, for example, because the input data signal 110 is played from an analogue input (and attenuation is performed by an analog frequency-dependent attenuation stage 122) or because the loudspeaker 125 is implemented as a digital loudspeaker using micro-electro-mechanical systems (MEMS). In another example, the audio reproduction system may not include a processing stage 121.

Figure 2:
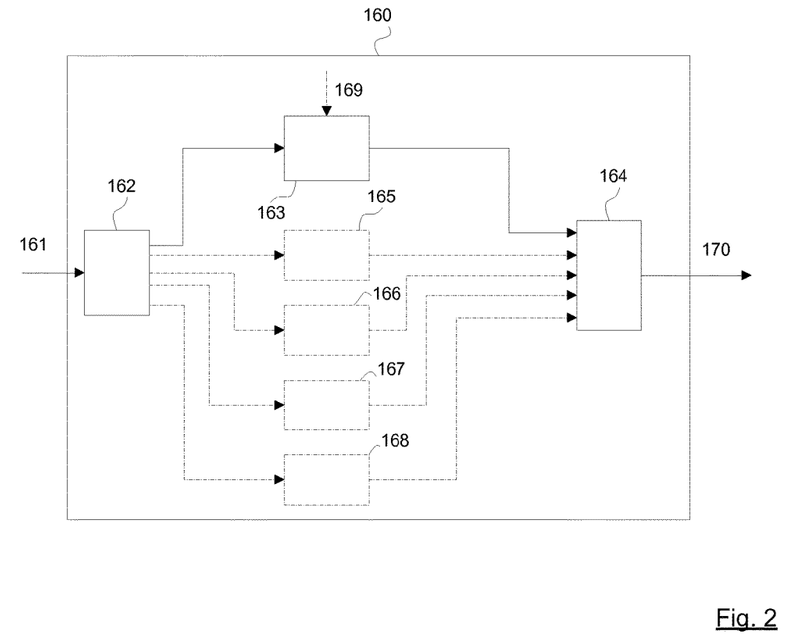
FIG. 2 is a generalized block diagram of a device, according to an example embodiment, for tuning a frequency-dependent attenuation stage.

FIG. 2 is a generalized block diagram of a device 160, according to example embodiments, for tuning the frequency-dependent attenuation stage 122 with the purpose of suppressing non-linear distortion occurring in the audio reproduction system 120 associated with the frequency-dependent attenuation stage 122. The device 160 comprises a receiving section 162 adapted to receive data 161 representing an output acoustic signal 140 recorded upon excitation of the audio reproduction system 120 by a predetermined input data signal 110. For example, the device 160 may comprise an interface (not shown in FIG. 2) adapted to provide the predetermined input audio signal 110 to the audio reproduction system 120, for example, via wired or wireless communication. Alternatively, the predetermined input audio signal 110 may be played by the audio reproduction system 120 from a file storage or may be received from some other device, and the device 160 may obtain knowledge about the predetermined input audio signal 110, for example, via separately received signaling and/or based on the received data 161. The acoustic transducer 150 shown in FIG. 1, recording the data 161 representing the output acoustic signal 140, may for example be comprised in the device 160 or may be arranged separately from the device 160.

According to a first example embodiment, the device 160 comprises a first distortion detection section 163 adapted to detect presence of non-linear distortion based on the received data 161 and to apply psycho-acoustic compensation to the detected non-linear distortion. The device 160 also comprises a control section 164 adapted to determine, based on the psycho-acoustically compensated non-linear distortion, control information 170 suitable for controlling the frequency-dependent attenuation stage 122. If, for example, the frequency-dependent attenuation stage 122 is a multi-band limiter, the control information 170 may indicate suitable thresholds to be applied by the multi-band limiter in respective frequency bands. If, for example, the frequency-dependent attenuation stage 122 is a timbre-preserving multi-band limiter of the type described in US patent application publication no. 2013/0013096 A1, the contents of which is incorporated herein in its entirety. Applying both fixed thresholds and time-varying thresholds, the control information 170 may for example indicate suitable values for the fixed thresholds.

Example operation of the first distortion detection section 163, according to the first example embodiment, will now be described with reference to FIGS. 3-5. Other example embodiments of the device 160 depicted in FIG. 2 will be described further below.

Figure 3:
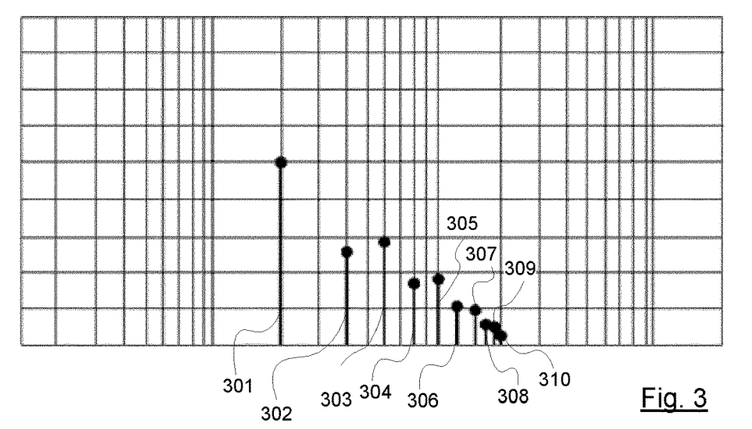
FIG. 3 schematically shows a double-logarithmic plot of an example spectrum of the output acoustic signal upon excitation of a non-linearly distorting audio reproduction system by an input data signal corresponding to a single-frequency audio signal.

FIG. 3 schematically shows a double-logarithmic plot of an example spectrum of the output acoustic signal 140 upon excitation of a non-linearly distorting audio reproduction system 120 by an input data signal 110 corresponding to a single-frequency audio signal. The spectrum is illustrated in FIG. 3 by plotting amplitude versus frequency. The output acoustic signal 140 comprises a first frequency component 301, also denoted by $c_1$, localized substantially at the same frequency as the single-frequency audio signal, but also a number of non-linear distortion components 302-310, also denoted by $c_i$, wherein $i \geq 2$, caused by non-linear distortion in the audio reproduction system 120 and located at other frequencies than the single-frequency audio signal. The example non-linear distortion components 302-310 depicted in FIG. 3 are harmonic distortion components located at integer multiples of the frequency of the single-frequency audio signal. The first distortion detection section 163 may detect the non-linear distortion components 302-310 based on knowledge of the single-frequency audio signal represented by the predetermined input data signal 110. Rather than tuning the frequency-dependent attenuation stage 122 to suppress the creation of the detected non-linear distortion components 302-310 as such, the device 160 first takes into account how the non-linear distortion components 302-310 may be perceived by a listener. In particular, rather than tuning the frequency-dependent attenuation stage 122 based on a power ratio $$\frac{\sum_{i=2}^{10} \text{RMS}(c_i)^2}{\text{RMS}(c_1)^2}$$

between the power of the first frequency component 301 and a sum of powers of the non-linear distortion components 302-310, a psycho-acoustic compensation is initially applied to the different components, as described below with reference to FIGS. 4 and 5. In the above described power ratio, RMS(c) denotes the root mean square of a component c, i.e.

$$\text{RMS}(c) = \sqrt{\frac{1}{T_2 - T_1} \int_{T_1}^{T_2} |c(t)|^2 \, dt},$$

such that the power of the first frequency component 301 may be expressed as $\text{RMS}(c_1)^2$ and the power of a non-linear distortion component may be expressed as $\text{RMS}(c_i)^2$.

Figure 4:
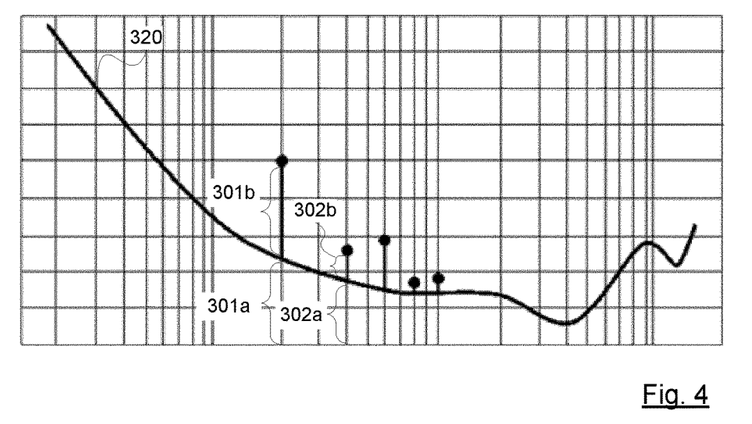
FIGS. 4 and 5 schematically show a frequency-dependent audibility threshold (solid line) and a masking threshold (dashed line), respectively, indicating psycho-acoustic effects that may be taken into account by a tuning device, according to example embodiments.

In FIG. 4, the spectrum shown in FIG. 3 is compared to a frequency-dependent audibility threshold 320 indicating threshold amplitudes for different frequency components to be audible/perceptible by a representative (or average) human listener. According to the first example embodiment, the first distortion detection section 163 applies psycho-acoustic compensation by disregarding spectral content of the detected non-linear distortion below the frequency-dependent audibility threshold 320. For example, some of the non-linear distortion components 306-310 do not reach above the audibility threshold 320 and are disregarded.

Optionally, the first distortion detection section 163 may disregard a portion 301a of the first frequency component 301 below the audibility threshold 320 and may disregard respective portions 302a of the detected non-linear distortion components 302-5 below the audibility threshold 320, and may for example only consider the remaining portion 301b of the first frequency component 301 and the respective remaining portions 302b of the detected non-linear distortion components 302-305 in any remaining processing steps.

Alternatively, the psycho-acoustic compensation applied by the first distortion detection section 163 may be expressed as a normalization of the power $\text{RMS}(c_1)^2$ of the first frequency component 301 and the powers $\text{RMS}(c_i)^2$ of the detected non-linear distortion components 302-306 with respect to the audibility threshold 320, prior to forming a power ratio $$\frac{\sum_{i=2}^{5} (\text{RMS}(c_i) - Th(f(c_i)))^2}{(\text{RMS}(c_1) - Th(f(c_1)))^2}$$

between the power of the first frequency component 301 and a sum of powers of the non-linear distortion components 302-310. In the above described power ratio, $Th(f(c_i))$ and $Th(f(c_i))$ denote root mean square levels of the audibility threshold 320 at the frequencies $f(c_1)$ and $f(c_i)$ of the first frequency component 301 and the non-linear distortion components 302-310, respectively. It is to be noted that the sum in the above described power ratio only includes four non-linear distortion components 302-305, as the other non-linear distortion components 306-310 do not reach above the audibility threshold 320. It is also to be noted that the non-linear distortion components 302-310 shown in FIGS. 3, 4 and 5 serve as an example, and that other example scenarios are envisaged in which any number of non-linear distortion components may be present in the acoustic output signal 140 and may be included in the above described power ratios.

According to the first example embodiment, the control section 164 is adapted to determine the control parameters 170 also based on the determined power ratio. For example, the control section 164 may apply a criterion $$\frac{\sum_{i=2}^{5}(\text{RMS}(c_i) - Th(f(c_i)))^2}{(\text{RMS}(c_1) - Th(f(c_1)))^2} \geq T$$

for determining when the power ratio is above a tolerance level T, indicating that the detected distortion is unacceptable. In order to avoid such unacceptable distortion in the acoustic output 140 of the audio reproduction system 120, the control section 164 may for example determine control information 170 for causing the frequency-dependent attenuation stage 122 to attenuate frequency and amplitude combinations which have been detected to cause distortion above such a tolerance level T.

The frequency-dependent audibility threshold 320 may for example be calibrated based on a sound pressure level 169 estimated in connection with the recording of the output acoustic signal 140 represented by the received data 161, for example, by selecting an appropriate audibility threshold from a look-up table comprising audibility thresholds associated with different sound pressure levels. For example, the sound pressure level 169 may be measured/estimated by a dedicated sound pressure level meter and may be received by the first distortion detection section 163. Alternatively, the acoustic transducer 150 may have been calibrated prior to the recording of the output acoustic signal 140, and the first distortion detection section 163 may be adapted to calibrate the frequency-dependent audibility threshold 320 based on known properties of the sound pressure level calibrated acoustic transducer 150.

Figure 5:
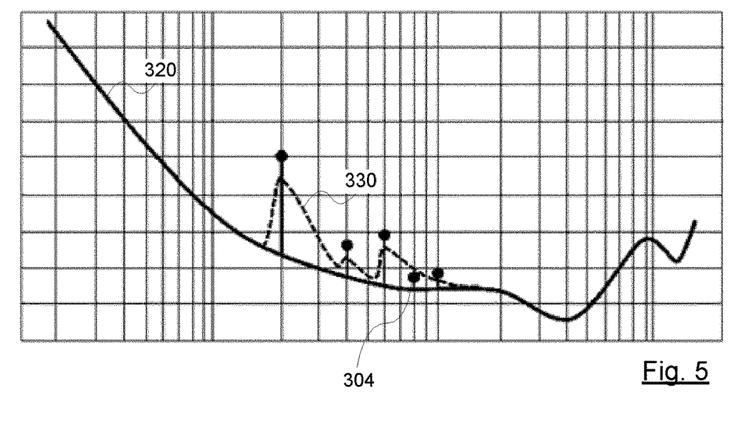

In FIG. 5, a masking threshold 330 has been included in the spectrum shown in FIG. 4, to indicate frequency masking as perceived by a an average human listener. The first frequency component 301 may have a masking effect on non-linear distortion (as well as other sound) in its spectral neighborhood. Similarly, a non-linear distortion component 302-310 may have a masking effect on other non-linear distortion components in its spectral neighborhood. Hence, spectral content of the detected non-linear distortion below the masking threshold 330 may not be audible/perceptible to a listener and may for example be disregarded when tuning the frequency-dependent attenuation stage 122. Hence, according to a second example embodiment, the first distortion detection section 163 estimates the masking threshold 330 based on the first frequency component 301 and notes that the first non-linear distortion component 302 reaches above the masking threshold 330. It then updates the masking threshold 330 by also taking into account masking caused by the first non-linear distortion components 302 and notes that the second non-linear distortion component 303 reaches above the updated masking threshold 330. It then updates the masking threshold 330 by also taking into account masking caused by the second non-linear distortion component 303 and notes that the third non-linear distortion component 304 is below the updated masking threshold 330. According to the second example embodiment, the first distortion detection section 163 applies psycho-acoustic compensation by at least disregarding the third non-linear distortion component 304 as it is below the masking threshold 330. According to the second example embodiment, the first distortion detection section 163 then forms a power ratio similar to the power ratio described with reference to FIG. 4, but where at least the third non-linear distortion component 304 is disregarded. The control section 164 then determines the control parameters 170 also based on the determined power ratio.

The frequency-dependent audibility threshold 320 and the masking threshold 330 described with reference to FIGS. 4 and 5, respectively, may be calibrated or estimated based on known properties of representative human listeners. As the perception of sound may vary between different listeners, the frequency-dependent audibility threshold 320 and the masking threshold 330 may for example be set low enough to ensure that non-linear distortion which may be audible for example, to listeners with very sensitive hearing, is not disregarded. Alternatively, weighting may be applied to the detected non-linear distortion components 302-10 prior to forming the power ratio, the weights being based on how far below or above the frequency-dependent audibility threshold 320 and/or the masking threshold 330 the amplitudes of the respective non-linear distortion component 302-10 extend.

All non-linear distortion components are typically not perceived as equally disturbing by listeners. The second harmonic component for example (i.e. the first non-linear distortion component 302 in FIG. 3), is often reported to have a much more subtle effect on the sound than a higher-order harmonic component (for example, the non-linear distortion component 310 in FIG. 3). Hence, the first distortion detection section 163 may for example assign harmonic indices to the detected non-linear distortion components 302-10 and may apply weights to the non-linear distortion components 302-10 based on their respective harmonic indices, prior to forming a power ratio between the power of the first frequency component 301 and a sum of powers of the non-linear distortion components 302-10.

An alternative to using the frequency-dependent audibility threshold 320 and/or the masking threshold 330, described with reference to FIGS. 4 and 5, is to evaluate the relative loudness of the first frequency component 301 and the detected non-linear distortion components 302-310, as perceived by a listener. For example, applying psycho-acoustic compensation may include estimating a loudness of the first frequency component 301 and a combined loudness of the detected non-linear distortion components 302-310. The control section 164 may for example be adapted to determine the control information 170 also based on a difference between the estimated loudnesses. Estimating loudness may for example include employing weighting filters, such as A-, B- or C-weightings. The combined loudness of the non-linear distortion components may for example be estimated using a loudness summation scheme. The analysis of non-linear distortion described above with reference to FIGS. 3-5 may for example be repeated for different frequency bands by employing predetermine input data signals 110 from the respective frequency bands, and the control section 164 may for example determine the control information 170 based on information about distortion properties for the respective frequency bands.

According to some example embodiments, the device 160 depicted in FIG. 2 may employ one or more distortion analysis methods in addition to the psycho-acoustic analysis methods described with reference to FIGS. 3-5.

A method for estimating the overall amount of non-linear distortion is to use relatively narrow-banded excitation signals at relatively low frequencies as the predetermined input data signal 110, to estimate high-frequency energy in the acoustic response 140, and to compare this to a pre-defined threshold. If there is non-negligible signal energy in the acoustic response 140 above the excitation frequency's bandwidth, this may be considered to be mainly caused by non-linear distortion. Hence, according to an example embodiment, the device 160 may comprise a second distortion detection section 165 adapted to obtain knowledge of a frequency range covering the spectral content of the predetermined input data signal 110, and to detect non-linear distortion based on spectral content of the received data 161 above the frequency range. In such estimation of the overall non-linear distortion, it may not be necessary to determine locations of particular frequency components, but energy content in a given frequency region may be sufficient input data for making the estimation.

A common distortion phenomenon especially in loudspeakers, here referred to as 'hard distortion', is the sudden increase of the amount of distortion when the excitation signal amplitude exceeds some limit value. The amount of distortion is typically relatively low for excitation signals below this limit, but becomes intolerably high for excitation signals above it. This can be considered to be a particular type of non-linear gain response. Using an input data signal 110 representing an audio signal with gradually increasing amplitude as excitation for the audio reproduction system 120, the device 160 may search for an abrupt spectral change in the acoustic response 140 indicating the presence of such a limit, and may estimate the input gain value corresponding to the limit. In particular, using narrow-band signals with increasing amplitude as excitation allows the limit value for hard distortion in the audio reproduction system 120 to be analyzed as a function of frequency. An abrupt spectral change in the acoustic response 140 may for example be detected by monitoring the spectral centroid and/or the cepstral maximum (e.g., max of cepstrum) of the response signal. Hence, according to an example embodiment, the device 160 may be adapted to receive data 161 recorded upon excitation of the audio reproduction system 120 by a sequence of predetermined input data signals 110, wherein consecutive predetermined input data signals 110 in the sequence correspond to increasingly amplified versions of a predetermined waveform. According to the present example embodiment, the device 160 may comprise a spectral composition analysis section 166 adapted to: monitor, based on the received data 161, the spectral composition of the output acoustic signals 140 of the audio reproduction system 120 resulting from excitation by the sequence of predetermined input data signals 110; detect an abrupt change in the monitored spectral composition; and determine an amplification value of the predetermined waveform corresponding to the detected abrupt change.

If, for example, the individual elements of the sequence of predetermined input data signals 110 are separated in time, for example, by input data representing silence, the spectral composition analysis section 166 may be adapted to determine the spectral composition of the output acoustic signal 140 of the audio reproduction system 120 at discrete points in time corresponding to the respective elements of the sequence of predetermined input data signals 110, and may be adapted to detect abrupt changes between the spectral compositions determined at the respective points in time.

If, for example, the predetermined waveform is a single sine signal, the sequence of predetermined input data signals 110 may be received by the audio reproduction system 120 in the form of a the single sine signal with for example, continuously increasing amplitude, and the spectral composition of the output acoustic signal 140 of the audio reproduction system 120 may for example, be monitored continuously by the spectral composition analysis section 166, rather than being monitored/determined at discrete points in time corresponding to individual elements of the sequence of predetermined input data signals 110.

Alternatively to using narrow-band signals with different frequency ranges as excitation for the audio reproduction system 120, a broadband excitation, such as music, may be used, and a dual-channel fast Fourier transform based analysis method may be utilized to estimate the amount of non-linear distortion. In particular, measuring the coherence between input and output signals of the audio reproduction system 120 gives an estimate of linear dependency between the input and output signals. Non-linear distortion products, as well as noise, in the response lower the coherence value, while linear and time-invariant processes do not have such an effect. Thus, under low-noise conditions, the inverse of the coherence value may be used as a measure of non-linear distortion in the case of wideband excitation signals. Hence, according to an example embodiment, the device 160 may comprise a correlation analysis section 167 adapted to determine coherence between the predetermined input data signal 110 and the received data 140. In order to improve time synchronization between the predetermined input data signal 110 and the received data 161, the correlation analysis section 167 may be adapted to: determine a cross-correlation between the predetermined input data signal 110 and the received data 161; estimate a sample rate difference between the predetermined input data signal 110 and the received data 161 based on the determined cross-correlation; and determine the coherence based on a re-sampled version of the received data 161.

Several available sound reproduction systems have dynamic range control (DRC) stages in addition to the frequency-dependent attenuation stage 122 of the audio reproduction system 120 depicted in FIG. 1. Some of these DRC stages cannot be bypassed or deactivated and may create disturbing audible artifacts which do not resemble 'traditional' non-linear distortion suited for analysis by the device 160. Hence, it may be beneficial for the device 160 to be able to detect any built-in DRC in the audio reproduction system 120, and to react to it in an appropriate manner, such as by instructing the frequency-dependent attenuation stage 122 to apply no limiting, i.e. to suspend attenuation.

Figure 6:
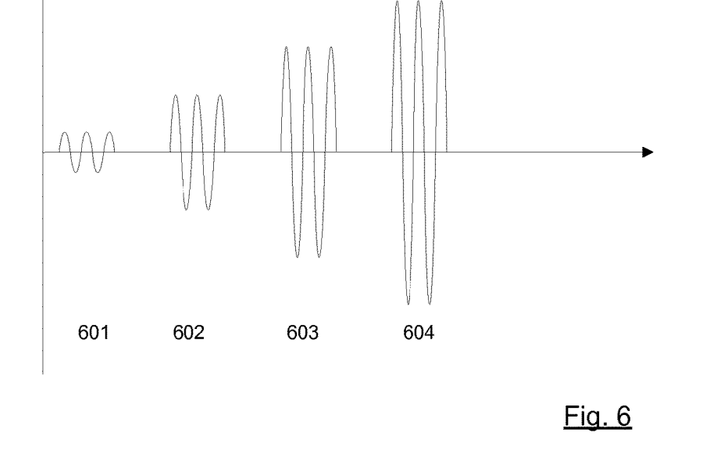
FIG. 6 schematically shows an example input signal used as excitation to an audio reproduction system, according to an example embodiment.
Figure 7A:
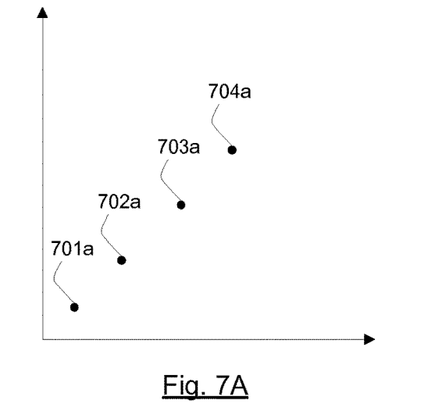
FIG. 7a schematically shows amplitudes of the example input signal shown in FIG. 6.

Hence, according to an example embodiment, the device 160 may be adapted to receive data 161 recorded upon excitation of the audio reproduction system 120 by input data signals 110 corresponding substantially to a single-frequency audio signal with increasing amplitude, as exemplified in FIG. 6 by sine signals 601-604 with increasing amplitude. According to the present example embodiment, the device 160 may comprise a DRC detection section 168 adapted to: monitor, based on the received data 161, the amplitude of a frequency component in the output acoustic signal 140 from the audio reproduction system 120, the monitored frequency component being localized substantially at the same frequency as the single-frequency audio signal 601-604; and detect a saturation of the monitored amplitude, evidencing presence of DRC in the audio reproduction system 120. The amplitude of the single-frequency audio signal 601-604 is illustrated in FIG. 7a by a sequence of amplitude values 701a-704a. The monitored amplitude, for example, the amplitude of a frequency component in the output acoustic signal 140 localized substantially at the same frequency as the single-frequency audio signal 601-604, is exemplified in FIG. 7b by a sequence of amplitude values

Figure 7B:
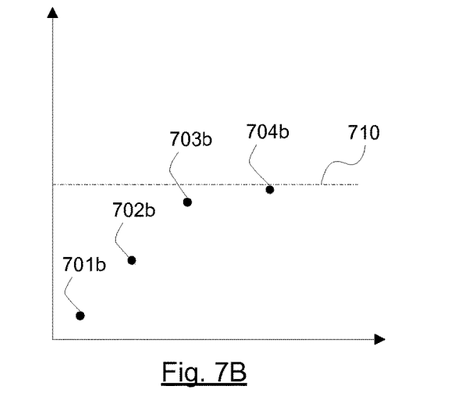
FIG. 7b schematically shows amplitudes of a frequency component in an example output signal of an audio reproduction system upon excitation by the example input signal shown in FIG. 6, wherein the frequency component is localized at the same frequency as the example input signal, and wherein the saturation may indicate presence of dynamic range control in the audio reproduction system.

701b-701b. As shown in FIGS. 7a and 7b, the input amplitude 701a-704a increases while the monitored output amplitude 701b-704b saturates at a level 710. The control section 164 may for example be adapted to determine, in response to the detection by the DRC detection section 168, control information 170 for causing the frequency-dependent attenuation stage 122 to suspend attenuation.

Alternatively to the sine signals 601-604 shown in FIG. 6, the input data signals 110 corresponding substantially to a single-frequency audio signal with increasing amplitude, used as excitation to the audio reproduction system 120, may be provided in the form of a continuously growing sine signal (rather than sine signals 601-604 separated in time). With such a continuously growing sine signal as excitation, the output amplitude may be monitored continuously by the DRC detection section 168, resulting in a curve, rather than the discrete amplitude values 701b-704b shown in FIG. 7.

Alternatively to receiving data 161 recorded upon excitation of the audio reproduction system 120 by input data signals 110 corresponding substantially to a single-frequency audio signal with increasing amplitude, the device 160 may be adapted to receive data recorded upon excitation of the audio reproduction system 120 by a sequence of predetermined input data signals, wherein consecutive predetermined input data signals in the sequence correspond to increasingly amplified versions of a predetermined waveform. The predetermined waveform may for example be a single sine signal, as exemplified in FIG. 6, but may also be a more composite signal. The DRC detection section 168 may be adapted to monitor, based on the received data 161, the amplitude of the output acoustic signal 140 from the audio reproduction system 120 resulting from excitation of the audio reproduction system 120 by the sequence and detect a saturation of the monitored amplitude, evidencing presence of DRC in the audio reproduction system 120. The spectral composition of the predetermined waveform may preferably be known by the device 160, so that operation of a loudspeaker 125 outside its linear operation range may be detected based on the spectral composition of the output acoustic signal 140, and so that a saturation evidencing presence of DRC may be distinguished from saturation caused by operation of a loudspeaker outside its linear operation range.

For a given audio reproduction system 120, there is typically an upper limit for the amplitudes obtainable in the acoustic output 140, for example, resulting from physical limitations in an amplification stage and/or in a loudspeaker, even without presence of DRC. By a detected saturation evidencing presence of DRC in the audio reproduction system 120 is meant a saturation of the monitored amplitude at a level 710 below such an upper limit.

According to some example embodiments, the DRC detection section 168 may be adapted to estimate the signal to noise ratio (SNR) in the acoustic output 140, for example, by considering what remains after removing spectral content at the same frequency as the single-frequency audio signal along with any harmonics which may be present due to non-linear distortion. Detection of saturation, as described with reference to FIGS. 7a and 7b, in combination with a detection of a high SNR, may indicate presence of DRC in the audio reproduction system 120. Hence, according to some example embodiments, the control section 164 may be adapted to determine, in response to the estimated SNR being above a predetermined threshold and the detection of saturation by the DRC detection section 168, control information 170 for causing the frequency-dependent attenuation stage 122 to suspend attenuation.

Figure 10:
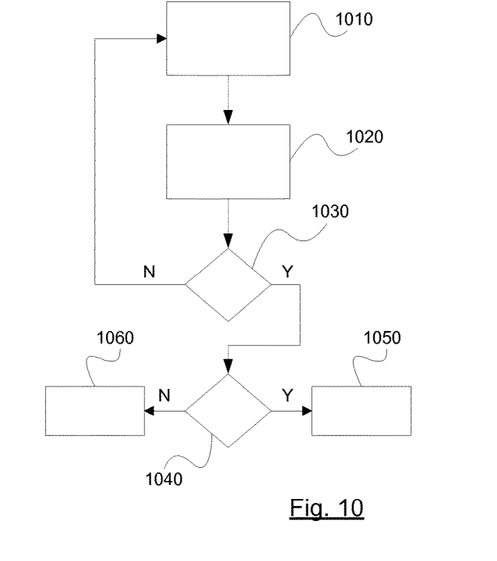
FIG. 10 is a flow chart of a method, according to an example embodiment, for detecting presence of DRC in an audio reproduction system.

FIG. 10 is a flow chart of a method, according to an example embodiment, for detecting presence of DRC in the audio reproduction system 120. The method may for example be employed by the DRC detection section 168 of the tuning device 160 described with reference to FIGS. 1 and 2, or by a separate DRC detection device, for example, arranged just like the tuning device 160 is arranged in FIG. 1, except that the DRC detection device may not be arranged to provide control information 170 to an attenuation stage 122. According to the present example embodiment, the method comprises receiving 1010 data recorded upon excitation of the audio reproduction system 120 by a sequence of predetermined input data signals, wherein consecutive predetermined input data signals in the sequence corresponds to increasingly amplified versions of a predetermined waveform and monitoring 1020, based on the received data, the amplitude of the output acoustic signal 140 from the audio reproduction system 120 resulting from excitation of the audio reproduction system 120 by the sequence. According to the present example embodiment, the method comprises detecting 1030 a saturation of the monitored amplitude, and, once a saturation is detected (indicated by Y in FIG. 10), determining 1040 whether the detected saturation indicates/evidences presence of DRC. Determining 1040 whether a detected saturation indicates/evidences presence of DRC may for example include comparing the amplitude/energy/power level at which the saturation has been detected to physical limitations in an amplification stage and/or in a loudspeaker of the audio reproduction system 120 (as described above), and/or considering whether an estimated SNR is sufficiently high (as described above). If no saturation is detected based on the already received data, corresponding to excitation of the audio reproduction system 120 up to some amplitude/energy/power level, the method returns (indicated by N in FIG. 10) to receiving 1010 more data, corresponding to excitation of the audio reproduction system 120 by higher amplitude/energy/power levels, and monitoring 1020 the received data for detecting 1030 a saturation at higher amplitude/energy/power levels. If a detected saturation is determined 1040 to indicate/evidence presence of DRC (indicated by Y in FIG. 10), further steps may be based on this decision, such as outputting/signaling 1050 detection of DRC, for example, to a control section 164 for determining control information 170, as described above with reference to FIG. 2. Optionally, if a detected saturation is determined 1040 to indicate/evidence presence of DRC, the method may return to receiving data 1010 representing an output acoustic signal 140 recorded upon excitation of the audio reproduction system 120 by input data signals 110 at different frequencies than previously employed as excitation. The detection of saturation for different excitation frequencies may be an even stronger indication of DRC in the audio reproduction system 120. If a detected saturation is determined 1040 not to indicate/evidence presence of DRC (indicated by N in FIG. 10), further steps may be based on this decision, such as outputting/signaling 1060 that presence of DRC has not (yet) been detected. In some audio reproduction systems 120 with DRC, presence of DRC may be more easily detected in certain frequency bands. Hence, if a detected saturation is determined 1040 not to indicate/evidence presence of DRC, the method may for example return to receiving data 1010 representing an output acoustic signal 140 recorded upon excitation of the audio reproduction system 120 by input data signals 110 at different frequencies than previously employed as excitation.

A number of example embodiments have been described above with reference to FIG. 2, in which the device 160 comprises, a second distortion detection section 165, a spectral composition analysis section 166, a correlation analysis section 167, and/or a DRC detection section 168, in addition to the first distortion detection section 163. Embodiments are envisaged in which the device 160 comprises any combination of these sections and in which the control section 164 determines the control information 170 based on any combination of the information determined by the respective sections. By determining the control information 170 based on different types of analysis of the non-linear distortion occurring in the audio reproduction system 120, the tuning of the frequency-dependent attenuation stage 122 may be improved and/or a more perceptually appealing balance may be achieved between audible non-linear distortion and overall loudness of the audio reproduction system 120. For example, the control information 170 may be based on a weighted combination of analysis results obtained in the respective sections 163, 165, 166, 167, 168.

It is to be noted that the analysis performed by at least some of the first distortion detection section 163, the second distortion detection section 165, the spectral composition analysis section 166, the correlation analysis section 167, and the DRC detection section 168, may employ different types of predetermined input audio signals 110 as excitation to the audio reproduction system 120. Hence, according to at least some example embodiments, a sequence of different types of predetermined input data signals 110 may be provided to the audio reproduction system 120 and the different sections may be adapted to perform their respective analyses after each other, for example, at different time points. The different sections illustrated in FIG. 2 may for example be implemented as multiple functions of a single processor, or may for example be implemented in two or more separate physical units/components.

If the device 160 has access to a large database of example device responses 140 and corresponding reference tunings of the frequency-dependent attenuation stage 122, for example, obtained by trained human tuners, a machine-learning approach, for example, based on neural networks, for finding the appropriate control information for tuning the frequency-dependent attenuation stage 122, may be employed. Hence, according to an example embodiment, the control section may be adapted to determine the control information by at least applying machine-learning based on a set of reference tunings of the frequency-dependent attenuation stage 122. For example, the device 160 may comprise storage section (not shown in FIG. 2) in which the reference tunings are stored.

Figure 8:
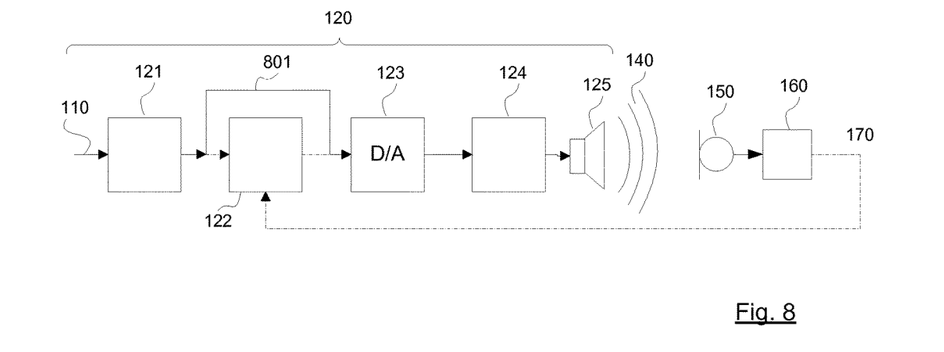
FIG. 8 is a generalized block diagram of an alternative example arrangement for tuning a frequency-dependent attenuation stage using a device according to an example embodiment.

As described in at least some example embodiments above, tuning of the frequency-dependent attenuation stage 122 using the arrangement depicted in FIG. 1 may include varying the amplitude of the excitation signal 110 and analyzing the acoustic response 140. FIG. 8 is a generalized block diagram of an alternative example arrangement for tuning the frequency-dependent attenuation stage 122, in which the frequency-dependent attenuation stage 122 may be bypassed 801, or its attenuation suspended, during tuning so as to analyze the non-linear distortion created in the audio reproduction system 120 without influence of the frequency-dependent attenuation stage 122.

However, if the frequency-dependent attenuation stage 122 is not a simple multi-band limiter, but has some functionality for varying the applied attenuation based for example, on the interaction between frequency regions/bands, such as the timbre-preserving multi-band limiter described in US patent application publication no. 2013/0013096 A1, the contents of which is incorporated herein in its entirety. It may be beneficial to include the frequency-dependent attenuation stage 122 in the measurement process, as illustrated in FIG. 1, and to adjust its parameters while measuring the acoustic output 140. In this case, the excitation signal 110 may for example be a stationary signal as the amount of non-linear distortion created may be varied by adjusting, via the control information 170, the attenuation provided by the frequency-dependent attenuation stage 122. Hence, according to an example embodiment, the device 160 may be adapted to receive data 161 recorded upon excitation of the audio reproduction system 120 by a constant input data signal 110 and the frequency-dependent attenuation stage 122 may be operable to attenuate the input data signal 110 based on the control information determined 170 by the control section of the device. According to the present example embodiment, the device 160 may be adapted to tune the frequency-dependent attenuation stage 122 by iteratively determining the control information 170 based on the received data 161.

In addition to analyzing the non-linear distortion occurring in an audio reproduction system 120, it may be beneficial to also estimate whether all frequency regions may be radiated as acoustic output signals 140 by the audio reproduction system 120. It may for example be beneficial to tune the frequency-dependent attenuation stage 122 to fully attenuate frequency regions which do not result in audible sound in the acoustic output 140 of the audio reproduction system 120, as doing so may prevent unnecessary power loss in the transducer and may also lead to additional distortion suppression. One approach to estimating whether a frequency can be radiated by the audio reproduction system 120 is to use a fixed-frequency sine signal as excitation 110, to estimate the cross-correlation between excitation 110 and acoustic response 140 for different lags between the excitation 110 and the acoustic response 140, and to check whether the maximum of the cross-correlation exceeds a given threshold.

Figure 9:
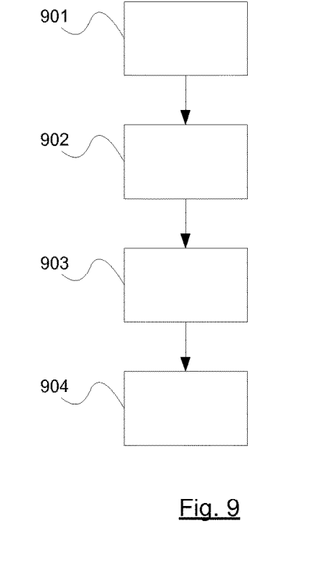
FIG. 9 is a flow chart of a method, according to an example embodiment, for tuning a frequency-dependent attenuation stage.

FIG. 9 is a flow chart of a method, according to an example embodiment, for tuning the frequency-dependent attenuation stage 122 with the purpose of suppressing non-linear distortion occurring in the audio reproduction system 120 associated with the frequency-dependent attenuation stage 122. The method comprises receiving 901 data 161 representing an output acoustic signal 140 recorded upon excitation of the audio reproduction system 120 by a predetermined input data signal 110, detecting 902 presence of non-linear distortion based on the received data 161, applying 903 psycho-acoustic compensation to the detected non-linear distortion and, based on the psycho-acoustically compensated non-linear distortion, determining 904 control information 170 suitable for controlling the frequency-dependent attenuation stage 122.

IV. Equivalents, Extensions, Alternatives and Miscellaneous

Further embodiments of the present disclosure will become apparent to a person skilled in the art after studying the description above. Even though the present description and drawings disclose embodiments and examples, the disclosure is not restricted to these specific examples. Numerous modifications and variations can be made without departing from the scope of the present disclosure, which is defined by the accompanying claims. Any reference signs appearing in the claims are not to be understood as limiting their scope.

Additionally, variations to the disclosed embodiments can be understood and effected by the skilled person in practicing the disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The devices and methods disclosed hereinabove may be implemented as software, firmware, hardware or a combination thereof. In a hardware implementation, the division of tasks between functional units referred to in the above description does not necessarily correspond to the division into physical units; to the contrary, one physical component may have multiple functionalities, and one task may be carried out by several physical components in cooperation. Certain components or all components may be implemented as software executed by a digital signal processor or microprocessor, or be implemented as hardware or as an application-specific integrated circuit. Such software may be distributed on computer readable media, which may comprise computer storage media (or non-transitory media) and communication media (or transitory media). As is well known to a person skilled in the art, the term computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media typically embodies computer readable instructions, data structures, program modules or other data in a modulated data signal such as a carrier wave or other transport mechanism and includes any information delivery media.

The invention claimed is:

1. A device for tuning a frequency-dependent attenuation stage with the purpose of suppressing non-linear distortion occurring in an audio reproduction system associated with the frequency-dependent attenuation stage, the audio reproduction system being arranged to supply an output acoustic signal in response to an input data signal, the device comprising:
   a receiving section adapted to receive data representing an output acoustic signal recorded upon excitation of the audio reproduction system by a predetermined input data signal;
   a first distortion detection section adapted to detect presence of non-linear distortion based on the received data and to apply psycho-acoustic compensation to the detected non-linear distortion, wherein the psycho-acoustic compensation compensates for a psycho-acoustic effect influencing how the detected non-linear distortion would be perceived by a listener; and
   a control section adapted to determine, based on the psycho-acoustically compensated non-linear distortion, control information suitable for controlling the frequency-dependent attenuation stage,
   wherein the first distortion detection section is adapted to apply psycho-acoustic compensation by at least disregarding spectral content of the detected non-linear distortion below a frequency-dependent audibility threshold, wherein, for a given frequency, the frequency-dependent audibility threshold is set based on a threshold amplitude/power/energy level for audibility by an average human listener at the given frequency, so that at least spectral content of the detected non-linear distortion that is perceived by the average human listener as sufficiently quiet is disregarded.

2. The device of claim 1, wherein the first distortion detection section is adapted to calibrate the frequency-dependent audibility threshold based on a sound pressure level estimated in connection with the recording of the output acoustic signal represented by the received data.

3. The device of claim 1, wherein the first distortion detection section is adapted to apply psycho-acoustic compensation by at least:
   obtaining knowledge of a first frequency component of the predetermined input data signal;
   estimating, based on the first frequency component, a masking threshold for a neighborhood of the first frequency component, the masking threshold indicating frequency masking relating to a masking effect of the first frequency component on sound in the neighborhood of the first frequency component, as perceived by the average human listener; and
   disregarding spectral content of the detected non-linear distortion below the masking threshold.

4. The device of claim 1, wherein the first distortion detection section is adapted to:
   obtain knowledge of a first frequency component of the predetermined input data signal; and
   detect, based on the received data, non-linear distortion components corresponding to the first frequency component.

5. The device of claim 4, wherein the first distortion detection section is adapted to determine a power ratio between the power of such spectral content of the received data that is localized substantially at the same frequency as the first frequency component and a sum of powers of said non-linear distortion components, and wherein the control section is adapted to determine the control information also based on said power ratio.

6. The device of claim 5, wherein the first distortion detection section is adapted to apply psycho-acoustic compensation at least by normalizing, prior to forming said power ratio, the power of said spectral content of the received data and the powers of said non-linear distortion components, with respect to a frequency-dependent audibility threshold.

7. The device of any of claim 4, wherein the first distortion detection section is adapted to apply psycho-acoustic compensation by at least:
   assigning harmonic indices to said non-linear distortion components; and
   applying weights to said non-linear distortion components based on said harmonic indices.

8. The device of claim 4, wherein the first distortion detection section is adapted to apply psycho-acoustic compensation at least by estimating a loudness of said spectral content of the received data and a combined loudness of said non-linear distortion components, and wherein the control section is adapted to determine the control information also based on a difference between the estimated loudnesses.

9. The device of claim 1, comprising a second distortion detection section adapted to:

obtain knowledge of a frequency range covering the spectral content of the predetermined input data signal; and detect non-linear distortion based on spectral content of the received data above said frequency range, wherein the control section is adapted to determine the control information also based on the non-linear distortion detected by the second distortion detection section.

10. The device of claim 1, adapted to receive data recorded upon excitation of the audio reproduction system by a sequence of predetermined input data signals, consecutive predetermined input data signals in said sequence corresponding to increasingly amplified versions of a predetermined waveform, the device comprising a spectral composition analysis section adapted to:

monitor, based on the received data, the spectral composition of the output acoustic signals of the audio reproduction system resulting from excitation by said sequence of predetermined input data signals;

detect an abrupt change in the monitored spectral composition; and determine an amplification value of said predetermined waveform corresponding to the detected abrupt change, wherein the control section is adapted to determine the control information also based on the amplification value determined by the spectral composition analysis section.

11. The device of claim 1, comprising a correlation analysis section adapted to determine coherence between the predetermined input data signal and the received data, wherein the control section is adapted to determine the control information also based on values of the coherence determined by the coherence analysis section.

12. The device of claim 11, wherein the correlation analysis section is adapted to:

determine a cross-correlation between the predetermined input data signal and the received data;

estimate a sample rate difference between the predetermined input data signal and the received data based on the determined cross-correlation; and determine said coherence based on a re-sampled version of the received data.

13. The device of claim 1, adapted to receive data recorded upon excitation of the audio reproduction system by a sequence of predetermined input data signals, consecutive predetermined input data signals in said sequence corresponding to increasingly amplified versions of a predetermined waveform, the device comprising a dynamic range control, DRC, detection section adapted to:

monitor, based on the received data, the amplitude of the output acoustic signal from the audio reproduction system resulting from excitation of the audio reproduction system by said sequence; and detect a saturation of the monitored amplitude, evidencing presence of DRC in the audio reproduction system, wherein the control section is adapted to determine the control information also based on an outcome of the detection by the DRC detection section.

14. The device of claim 13, wherein the control section is adapted to determine, in response to the detection by the DRC detection section, control information for causing the frequency-dependent attenuation stage to suspend attenuation.

15. The device of claim 1, adapted to receive data recorded upon excitation of the audio reproduction system by a constant input data signal, the device being adapted to tune a frequency-dependent attenuation stage which is comprised in the audio reproduction system and is operable to attenuate the input data signal based on the control information determined by the control section of the device, wherein the device is adapted to tune the frequency-dependent attenuation stage by iteratively determining the control information based on the received data.

16. The device of claim 1 wherein the control section is adapted to determine the control information by at least applying machine-learning based on a set of reference tunings of the frequency-dependent attenuation stage.

17. The device of claim 1, further comprising:

an interface adapted to provide the predetermined input data signal to the audio reproduction system.

18. The device of claim 1, further comprising:

an acoustic transducer adapted to record acoustic output from the audio reproduction system and to provide said data to the receiving section.

19. A method for tuning a frequency-dependent attenuation stage with the purpose of suppressing non-linear distortion occurring in an audio reproduction system associated with the frequency-dependent attenuation stage, the audio reproduction system being arranged to supply an output acoustic signal in response to an input data signal, the method comprising:

receiving data representing an output acoustic signal recorded upon excitation of the audio reproduction system by a predetermined input data signal;

detecting presence of non-linear distortion based on the received data;

applying psycho-acoustic compensation to the detected non-linear distortion, wherein the psycho-acoustic compensation compensates for a psycho-acoustic effect influencing how the detected non-linear distortion would be perceived by a listener, wherein the psycho-acoustic compensation is applied by at least disregarding spectral content of the detected non-linear distortion below a frequency-dependent audibility threshold, wherein, for a given frequency, the frequency-dependent audibility threshold is set based on threshold amplitude/power/energy level for audibility by an average human listener at the given frequency, so that at least spectral content of the detected non-linear distortion that is perceived by the average human listener as sufficiently quiet is disregarded; and based on the psycho-acoustically compensated non-linear distortion, determining control information suitable for controlling the frequency-dependent attenuation stage.

20. A non-transitory computer readable storage medium, comprising software instructions, which when executed by one or more processors cause a computer to execute the method of claim 19.

* * * * *